United States Patent
Niimi et al.

(10) Patent No.: US 10,899,965 B2
(45) Date of Patent: Jan. 26, 2021

(54) FLUORESCENT MATERIAL PARTICLES, METHOD FOR PRODUCING THE SAME, AND LIGHT EMITTING DEVICE

(71) Applicant: NICHIA CORPORATION, Anan (JP)

(72) Inventors: Tsunehito Niimi, Anan (JP); Koji Kajikawa, Tokushima (JP); Hirofumi Ooguri, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 103 days.

(21) Appl. No.: 15/083,576

(22) Filed: Mar. 29, 2016

(65) Prior Publication Data

US 2016/0289555 A1    Oct. 6, 2016

(30) Foreign Application Priority Data

Mar. 30, 2015  (JP) ................. 2015-068724
Sep. 11, 2015  (JP) ................. 2015-179435
Mar. 18, 2016  (JP) ................. 2016-055082

(51) Int. Cl.
*C09K 11/77* (2006.01)
*C09K 11/02* (2006.01)
*H01L 33/50* (2010.01)

(52) U.S. Cl.
CPC ........ *C09K 11/7731* (2013.01); *C09K 11/025* (2013.01); *H01L 33/502* (2013.01)

(58) Field of Classification Search
CPC . C09K 11/025; C09K 11/645; C09K 11/7731; H01L 33/502
USPC ................... 252/301.4 R, 301.4 S
See application file for complete search history.

(56) References Cited

U.S. PATENT DOCUMENTS

| 2006/0255713 A1* | 11/2006 | Kondo | C09K 11/025 313/486 |
| 2011/0001159 A1* | 1/2011 | Nakamura | B82Y 20/00 257/98 |
| 2011/0042704 A1* | 2/2011 | Kim | C09K 11/025 257/98 |
| 2013/0127332 A1* | 5/2013 | Chen | C09K 11/025 313/503 |
| 2017/0101579 A1* | 4/2017 | Inamura | H01L 31/055 |

FOREIGN PATENT DOCUMENTS

| JP | H04-230996 A | 8/1992 |
| JP | H07-005884 A | 1/1995 |
| JP | 2002-223008 A | 8/2002 |
| JP | 2006-265326 A | 10/2006 |
| JP | 2008-143978 A | 6/2008 |

(Continued)

OTHER PUBLICATIONS

Machine translation of JP 2008143978 A, printed Dec. 22,2017, 17 pages.*

(Continued)

*Primary Examiner* — Matthew E. Hoban
*Assistant Examiner* — Lynne Edmondson
(74) *Attorney, Agent, or Firm* — Hunton Andrews Kurth LLP (57) ABSTRACT

A fluorescent material particle including: a particle that contains a thiogallate phosphor and a first adherent member containing boron oxide and being disposed on the surface of the particle, a method for producing the fluorescent material particles, and a light emitting device are provided.

27 Claims, 3 Drawing Sheets (56) References Cited

FOREIGN PATENT DOCUMENTS

| | | | |
|---|---|---|---|
| JP | 2008143978 A * | 6/2008 | |
| JP | 2009-013186 A | 1/2009 | |
| JP | 2013-119581 A | 6/2013 | |
| JP | 2015-063619 A | 4/2015 | |
| JP | WO 2015146231 A1 * | 10/2015 | ........... H01L 31/055 |
| WO | 2012-077656 A1 | 6/2012 | |
| WO | 2015-146231 A1 | 10/2015 | |

OTHER PUBLICATIONS

Machine translation of JP 2008143978 A, printed Dec. 22, 2017, 17 pages. (Year: 2008).*

* cited by examiner

FLUORESCENT MATERIAL PARTICLES, METHOD FOR PRODUCING THE SAME, AND LIGHT EMITTING DEVICE

CROSS-REFERENCE TO RELATED APPLICATIONS

This application claims priority to Japanese Patent Application No. 2015-068724 filed on Mar. 30, 2015 and Japanese Patent Application No. 2015-179435 filed on Sep. 11, 2015 and Japanese Patent Application No. 2016-055082 filed on Mar. 18, 2016. The entire disclosure of Japanese Patent Applications No. 2015-068724, No. 2015-179435 and No. 2016-055082 is hereby incorporated herein by reference.

BACKGROUND OF THE INVENTION

Field of the Invention

The present disclosure relates to fluorescent material particles, a method for producing the fluorescent material particles, and a light emitting device.

Description of the Related Art

The emission intensity of sulfide fluorescent materials is known to decrease under high temperatures and high humidity. This is because such a fluorescent material is likely to be hydrolyzed by moisture in the air, with the result that it changes and degrades into a metallic hydroxide or a hydrogen sulfide.

In relation to this, a light emitting element including a fluorescent material coated with a material chosen from the group comprising organic materials, inorganic materials, and glass materials is known (see, e.g., JP 2002-223008 A). A coated fluorescent material prepared by applying a silicon dioxide film containing a metal oxide powder on a sulfide fluorescent material is known (see, e.g., JP 2013-119581 A).

SUMMARY OF THE INVENTION

A fluorescent material particle includes a particle that contains a thiogallate phosphor and a first adherent member that contains boron oxide and is disposed on a surface of the particle. The fluorescent material particle of a sulfide-based phosphor can exhibit superior moisture resistance.

DETAILED DESCRIPTION OF EMBODIMENT

Conventional sulfide fluorescent materials may fail to achieve sufficient moisture resistance. An embodiment according to the present disclosure provides particles of a sulfide-based fluorescent material with superior moisture resistance.

Specific means for solving the problem are as follows, and the present disclosure includes the following aspects.

A first aspect of the present disclosure is a fluorescent material particle including a particle containing a thiogallate phosphor, and an adherent member containing boron oxide and being disposed on the particle.

A second aspect of the present disclosure is a light emitting device including a fluorescent material that contains the above-described fluorescent material particles, and a light source that emits light having a peak light emission wavelength in the range of from 380 nm to 485 nm.

A third aspect of the present disclosure is a method for producing the above-described fluorescent material particles. The method includes performing a first treatment of a mixture that contains particles containing a thiogallate phosphor and a boron compound under the conditions of a temperature of from 50° C. to 150° C. and a relative humidity of from 80% to 100%, and performing a second treatment of the mixture after the first treatment under the condition of a temperature of from 200° C. to 1000° C.

According to one embodiment of the present disclosure, sulfide-based fluorescent material particles superior in moisture resistance can be provided.

Hereinafter, the fluorescent material particles, the method for producing the same, and the light emitting device according to the present disclosure will be described with reference to the embodiments. The embodiments shown below, however, are mere examples of the fluorescent material particles, the method for producing the same, and the light emitting device for embodying the technical concept of the present invention, and the present invention is not to be limited to the particulars of the fluorescent material particles, the method for producing the same, and the light emitting device described below. The relationships between the color names and the chromaticity coordinates, the relationships between the wavelength ranges of light and the color names of monochromatic light, and others are in accordance with JIS Z8110. In the present specification, for the amount of each component contained in the composition, when a plurality of substances corresponding to the component exists, the amount of the component indicates the total amount of the substances present in the composition unless otherwise specified.

Fluorescent Material Particles

The fluorescent material particle of the present embodiment is a sulfide-based fluorescent material particle including a particle that contains a thiogallate phosphor (hereinafter also referred to as "core particle") and a first adherent member that contains boron oxide and is disposed on the surface of the particle.

The fluorescent material particle of the present embodiment including a first adherent member that contains boron oxide on the surface of the core particle has superior moisture resistance, so that reduction in emission intensity is suppressed even under high temperatures and high humidity. In addition, generation of gas, such as hydrogen sulfide, associated with hydrolysis is suppressed. Furthermore, a light emitting device incorporating the fluorescent material particles can achieve long-term reliability.

The thiogallate phosphor that is contained in the core particle may have a composition, for example, represented by formula (Ia) in view of emission properties.

$$(M^1_{1-x}M^2_x)Ga_{2-y}S_{4-z} \qquad (Ia)$$

In formula (Ia), $M^1$ denotes at least one element selected from the group consisting of Sr, Be, Mg, Ca, Ba, and Zn, $M^2$ denotes at least one element selected form the group consisting of Eu and Ce, and x, y and z satisfy 0.03≤x≤0.25, −0.2≤y≤0.2 and −0.2<z<0.2.

In the thiogallate phosphor having a composition represented by formula (Ia), as long as the phosphor can emit a fluorescent of green to yellow-green color, a part of Ga can be replaced with at least one element selected from the group consisting of Al and In, and a part of S can be replaced with at least one element selected from the group consisting of Se and Te. In the thiogallate phosphor having a composition represented by formula (Ia), $M^1$ may contain Sr and $M^2$ may contain Eu. In such case, as long as the phosphor can emit a fluorescent of green to yellow-green color, a part of Sr can be replaced with at least one element selected from the group consisting of Be, Mg, Ca, Ba and Zn, and a part of Eu can be replaced with Ce.

The thiogallate phosphor that is contained in the core particle may have a composition, for example, represented by formula (Ib) in view of emission properties.

$(Sr_{1-v-w}M^3_w Eu_v)Ga_2S_4$           (Ib)

In formula (Ib), $M^3$ denotes at least one element selected from the group consisting of Be, Mg, Ca, Ba, and Zn, and v and w satisfy 0.03≤v≤70.25, 0≤w<0.97 and v+w<1.

In formula (Ib), v is from 0.03 to 0.25, and is preferably from 0.03 to 0.17. When v is equal to or more than 0.03, sufficient luminous efficiency may be achieved when the fluorescent material particles are excited with a light emitting element that emits blue light. When w is equal to or less than 0.25, sufficient emission intensity may be achieved because of, for example, suppressing concentration quenching. w is from 0 to less than 0.97, preferably from 0 to 0.9, and more preferably from 0 to 0.8.

In the thiogallate phosphor having a composition represented by formula (Ib), as long as the phosphor can emit a fluorescent of green to yellow-green color, a part of Ga can be replaced with at least one element selected from the group consisting of Al and In, and a part of S can be replaced with at least one element selected from the group consisting of Se and Te.

The mean particle diameter of the core particle is not particularly limited and may be appropriately selected according to, for example, the purpose. The mean particle diameter of the core particle is, for example, from 1 μm to 20 μm, and is preferably from 3 μm to 20 μm. Here, a mean particle diameter is a numerical value called Fisher Sub Sieve Sizer's No., that is determined by measuring the specific surface area of the primary particles by the air permeability method and calculating the mean value of the particle diameters of the primary particles. The mean particle diameter is measured by, for example, Fisher Sub Sieve Sizer (manufactured by Fisher).

The adherent member contains at least boron oxide, and may further contain other compounds in addition to boron oxide. Examples of the compounds that may be added in addition to boron oxide include aluminum oxide and silicon oxide (silica). The presence of boron oxide in the first adherent member can be confirmed by measuring the infrared absorbing spectrum on the surface of the fluorescent material particles. Specifically, the presence of boron oxide on the surface of the fluorescent material particles can be confirmed by measuring the infrared absorbing spectrum on the surface of the fluorescent material particles by the attenuated total reflectance method (ATR method) using an FT-IR measuring device and checking the presence of a peak unique to boron oxide (e.g., around 1260 cm$^{-1}$). Alternatively, the presence of boron oxide may be confirmed by the disappearance of the peaks unique to compounds that are precursors of boron oxide (e.g., around 2800 cm$^{-1}$ to 3400 cm$^{-1}$ derived from boric acid).

The first adherent member preferably essentially consists of boron oxide rather than containing, for example, silica. Here, the term "essentially" means that the contents of the components other than boron oxide in the first adherent member account for, for example, 10% by mass or less, or 1% by mass or less. This is likely to result in superior moisture resistance.

The content of boron oxide in terms of the content by percentage of boron element in the entire fluorescent material particles is, for example, preferably 0.1% by mass or more, more preferably 0.3% by mass or more, still more preferably 0.4% by mass or more, even still more preferably 0.6% by mass or more, even still more preferably 1% by mass or more, and particularly preferably 1.6% by mass or more. Although the upper limit of the content of boron oxide in terms of the content by percentage of boron element in the entire fluorescent material particles is not particularly limited, it is preferably 10% by mass or less, more preferably 8% by mass or less, still more preferably 7.6% by mass or less, even still more preferably 5.0% by mass or less, and particularly preferably 3.3% by mass or less. When the content of boron oxide in terms of the content by percentage of boron element is 0.1% by mass or more, the moisture resistance is likely to be further improved, and when it is 10% by mass or less, superior luminous efficiency is likely to be achieved.

The content by percentage of the boron element contained in the fluorescent material particles can be measured by using, for example, an inductive coupling plasma emission analyzer (ICP analyzer). When the first adherent member contains other boron compounds in addition to boron oxide, the boron element derived from the other compounds is included in the content by percentage of the boron element contained in the fluorescent material particles.

The first adherent member may be adhered to at least a region on the surface of the core particle. In view of moisture resistance, the adherent member is preferably adhered to 50% or more, and more preferably 75% or more of the surface area of the core particle. Still more preferably, the first adherent member is applied to substantially the entire surface of the core particle. Here, "applied to substantially the entire surface" means that, for example, in the observation of a 10,000×SEM image, there is no region where the first adherent member is not observed. That is, in the SEM image observation, the first adherent member is present at a high percentage on the entire surface region. If the core particles form an aggregate, the first adherent member may be adhered to the surface of the aggregate as a whole.

The first adherent member may be adhered to the core particle either by physical adhesion (e.g., intermolecular force) or a chemical bond.

The thickness of the first adherent member is not particularly limited, and may be appropriately selected according to, for example, the core particle diameter. The thickness of the first adherent member is, for example, 0.05 μm or more, preferably 0.1 μm or more, and particularly preferably 0.2 μm or more. Meanwhile, the thickness of the first adherent member is, for example, 0.8 μm or less, preferably 0.6 μm or less, and is particularly preferably 0.5 μm or less. The average percentage of the thickness of the adherent member relative to the particle diameter of the fluorescent material particles is preferably 1% or more, more preferably 2% or more, still more preferably 2.4% or more, even still more preferably 3% or more, and particularly preferably 5% or more. Meanwhile, the average percentage of the thickness of the adherent member relative to the particle diameter of the fluorescent material particle is preferably 25% or less, more preferably 20% or less, still more preferably 19.5% or less, even still more preferably 13.5% or less, and particularly preferably 12.8% or less. When the average percentage of the thickness is the lower limit or more, the moisture resistance is likely to be further improved, and when the average percentage of the thickness is the upper limit or less, the occurrence of cracks is likely to be minimized and ease of handling of the fluorescent material particles is likely to be further improved.

The average percentage of the thickness of the first adherent member relative to the particle diameter of the fluorescent material particle is obtained as follows. First, the percentage of the thickness of the first adherent member relative to the long diameter of the fluorescent material particle is determined for three fluorescent material particles by observing an image acquired by scanning electron microscopy (SEM). Then the average percentage of the thickness of the first adherent member relative to the particle diameter of the fluorescent material particle is obtained as an arithmetic mean value of the three particles.

The fluorescent material particles to be measured are randomly selected from the particles having a long diameter of from 3 µm to 10 µm. When a plurality of the fluorescent material particles forms an aggregate, the respective fluorescent material particles forming the aggregate are to be measured. Cross sectional images of the fluorescent material particles are observed using SEM at 10,000 to 20,000 power magnification, utilizing the difference in contrast between the core particle and the adherent member. The long diameter of the fluorescent material particle is the longest line segment among the line segments connecting the two points selected from the outermost periphery of the cross section of the respective fluorescent material particles.

The mean particle diameter of the fluorescent material particles is not particularly limited, and may be appropriately selected according to the purpose, for example. In view of the moisture resistance, the mean particle diameter of the fluorescent material particles is preferably 1 µm or more, and more preferably 3 µm or more. In view of the ease of handling of the particles in producing a light emitting device, the mean particle diameter of the fluorescent material particles is preferably 30 µm or less, more preferably 25 µm or less, and still more preferably 20 µm or less. The mean particle diameter of the fluorescent material particles is determined in a manner similar to that of the mean particle diameter of the core particle.

On at least a region on the surface of the first adherent member, a second adherent member containing aluminum oxide is preferably further disposed. The presence of aluminum oxide in the second adherent member can be confirmed by, for example, measuring the infrared absorbing spectrum on the surface of the fluorescent material particles.

The second adherent member preferably essentially consists of aluminum oxide rather than containing other metal oxides or the like in addition to aluminum. Here, "essentially" means that the contents of the components other than aluminum oxide in the second adherent member account for, for example, 10% by mass or less, or 1% by mass or less. This is likely to result in superior moisture resistance.

The contents of aluminum oxide in terms of the content by percentage of aluminum element in the entire fluorescent material particles is preferably 1% by mass or more, and more preferably 2% by mass or more, for example. Although the upper limit of the content of aluminum oxide in terms of the content by percentage of aluminum element in the entire fluorescent material particles is not particularly limited, it is preferably 4% by mass or less, and more preferably 3% by mass or less. When the content of aluminum oxide in terms of the content by percentage of aluminum element is 1% by mass or more, the moisture resistance is likely to be further improved, and when it is 4% by mass or less, a higher initial luminous flux is likely to be achieved in a light emitting device produced.

The content by percentage of the aluminum element contained in the fluorescent material particles can be determined in the same manner as described for the content by percentage of boron element.

The second adherent member may be disposed on at least the surface of the first adherent member, and may also be disposed on a region of the surface of the core particle where the first adherent member is not disposed, i.e., directly on the core particle. The percentage of the area where the second adherent member is disposed relative to the entire area of the first adherent member disposed on the core particle is, for example, 50% or more, and preferably 75% or more, and more preferably substantially the entire surface of the first adherent member. Here "substantially" means, for example, there is no region of the first adherent member where the second adherent member is not observed in the observation of a 10,000×SEM image.

The adhesion of the second adherent member to the first adherent member may be either by physical adhesion (e.g., intermolecular force) or a chemical bond.

The thickness of the second adherent member is not particularly limited, and may be appropriately selected according to, for example, the core particle diameter. The thickness of the second adherent member is, for example, 0.05 µm or more, and preferably 0.1 µm or more. The thickness of the second adherent member is also, for example, 1.5 µm or less, and preferably 1.0 µm or less. The average percentage of the thickness of the adherent member relative to the particle diameter of the fluorescent material particle is, for example, 1.5% or more, and preferably 3% or more. Meanwhile, the average percentage of the thickness of the adherent member relative to the particle diameter of the fluorescent material particle is, for example, 20% or less, and preferably 15% or less. When the average percentage of the thickness is the lower limit or more, the moisture resistance is likely to be further improved, and when the average percentage of the thickness is the upper limit or less, the occurrence of cracks is minimized and ease of handling of the fluorescent material particles is likely to be further improved. The average percentage of the thickness of the second adherent member relative to the particle diameter of the fluorescent material particle can be determined in the same manner as described for the average percentage of the thickness of the first adherent member.

The percentage of the content of aluminum element relative to the content of boron element in the entire fluorescent material particles is, when the content by percentage of aluminum element is from 2% by mass to 3% by mass, for example, 50% or more, and preferably 70% or more. Meanwhile, the percentage of the content is, for example, 650% or less, and preferably 300% or less. When the percentage of the content is the upper limit or less, the moisture resistance is likely to be further improved. When the percentage of the content is the lower limit or more, occurrence of cracks in the second adherent member is likely to be further minimized.

The ratio of the thickness of the second adherent member to the thickness of the first adherent member in the long diameter of the fluorescent material particle is, when the average percentage of the thickness of the second adherent member is from 3% to 15%, for example, 0.5 or more, and preferably 0.6 or more. The ratio of the thickness is also, for example, 4.5 or less, and preferably 3 or less. When the ratio of the thickness is the upper limit or less, the moisture resistance is likely to be further improved. When the ratio of thickness is the lower limit or more, the occurrence of cracks in the second adherent member is likely to be further minimized.

Method for Producing the Fluorescent Material Particles

The method for producing the fluorescent material particles of the present embodiment includes performing a first treatment of a mixture that contains particles (core particles) containing a thiogallate phosphor and a boron compound under the conditions of a temperature of from 50° C. to 150° C. and a relative humidity of from 80% to 100%, and performing, after the first treatment, a second treatment of the mixture under the conditions of a temperature of from 200° C. to 1000° C.

Performing the second treatment after the first treatment allows efficient formation of an adherent member that contains boron oxide and has a desired thickness on the surface of the core particle. In the present embodiment, the first treatment facilitates, for example, uniform adhesion of the boron compound on the surface of the core particle. In addition, the second treatment at a temperature in the temperature range facilitates efficient conversion of the boron compound to a boron oxide.

The method for producing the fluorescent material particles may further include preparing particles (core particles) containing a thiogallate phosphor before the first treatment. The core particles may be produced by a known method. Specifically, for example, $(Sr,Eu)SO_3$ and $Ga(SO_4)OH$ as starting materials are weighed so as to have a desired composition and then dry-mixed to form a raw mixture. The resultant raw mixture undergoes heat treatment, for example, at a temperature of from 900° C. to 1100° C. for 1 hour to 100 hours in the atmosphere of hydrogen sulfide to yield core particles of the desired composition. The resultant core particles may undergo, for example, dispersion treatment, drying treatment, and sifting treatment.

The boron compound used in the first treatment is not particularly limited as long as the compound can form an adherent member that contains boron oxide in the second treatment. Examples of the boron compound include boric acid $(H_3BO_3)$, metaboric acid $(HBO_2)$, tetraboric acid $(H_2B_4O_7)$, borate $(M_3(BO_3)_2)$, metaborate $(M(BO_2)_2)$, tetraborate $(MB_4O_7)$, and boron oxide $(B_2O_3)$, and at least one selected from the group consisting of them is preferable, and at least one selected from the group consisting of boric acid $(H_3BO_3)$, metaboric acid $(HBO_2)$, tetraboric acid $(H_2B_4O_7)$, and boron oxide $(B_2O_3)$ is more preferable. M in the metaborate and so forth is at least one element selected from the group consisting of Be, Mg, Ca, Sr, and Ba.

The content ratio of the boron compound to the core particle in the mixture of the first treatment may be appropriately selected so that the desired content of the adherent member can be obtained. The mixing ratio of the boron compound to the core particle, for example, is preferably from 0.5% by mass to 15% by mass, and more preferably from 1% by mass to 5% by mass.

The method of mixing the core particles and the boron compound is not particularly limited, and may be appropriately selected from common mixing methods. Specifically, a mixture can be obtained by using a double cone mixer.

Furthermore, the mixing of the core particles and the boron compounds may be performed by any of dry mixing treatment, wet mixing treatment, and spray dry treatment, and is preferably performed by dry mixing treatment.

In the first treatment, the mixture of the core particles and the boron compound is subjected to the conditions of a temperature of from 50° C. to 150° C. and a relative humidity of from 80% to 100%. In the first treatment, the mixture may be stirred if necessary.

To acquire a further uniform adherent member, the temperature in the first treatment is preferably from 85° C. to 140° C., and more preferably from 100° C. to 140° C. The relative humidity in the first treatment is preferably from 85% to 100%, and more preferably from 90% to 100%. The pressure in the first treatment is not particularly limited. The pressure is preferably from 0.1 MPa to 0.6 MPa, more preferably from 0.1 MPa to 0.3 MPa, and still more preferably from 0.2 MPa to 0.3 MPa.

The time for the first treatment may be appropriately selected depending on the treatment conditions. The time for the treatment is preferably from 0.5 hour to 50 hours, and more preferably 1 hour to 10 hours.

The atmosphere in the first treatment is not particularly limited, and may be the air atmosphere, or an atmosphere of an inert gas, such as nitrogen gas.

The first treatment may be performed by, for example, in a pressure cooker test apparatus (PCT apparatus).

In the second treatment, the mixture after the first treatment is subjected to a temperature condition of from 200° C. to 1000° C. In the second treatment, the mixture may be stirred if necessary.

In view of moisture resistance and heat resistance, the temperature in the second treatment is preferably from 300° C. to 800° C., and more preferably from 400° C. to 700° C.

The pressure condition in the second treatment is not particularly limited, and may be appropriately selected depending on, for example, the purpose.

The time required for the second treatment may be appropriately selected depending on the treatment conditions. The treatment time is preferably from 1 hour to 100 hours, and more preferably 3 hour to 20 hours.

The atmosphere in the second treatment is not particularly limited, and may be the air atmosphere, or an atmosphere of an inert gas, such as nitrogen gas.

The second treatment may be performed, for example, in a kiln.

In the method for producing the fluorescent material particles, the first treatment and the second treatment may be performed sequentially. Alternatively, after the first treatment, for example, dispersion treatment, drying treatment, and classification treatment may be performed as appropriate, and then the second treatment may be performed.

The first treatment and the second treatment may be repeated several times as needed. For example, the first treatment may be repeated several times, and then the second treatment may be performed at least once. Alternatively, after the first treatment and the second treatment are performed, the first treatment and the second treatment may be repeatedly performed.

The method for producing the fluorescent material particles may further include, after the second treatment, dispersion treatment, drying treatment, classification treatment, for example, as appropriate.

The method for producing the fluorescent material particles may further include a third treatment that generates aluminum oxide compounds from organic aluminum compounds in the presence of the mixture that has undergone the second treatment. In the third treatment, the generated aluminum oxide forms a second adherent member by adhering to the first adherent member adhered to the core particles, or to the core particle. The aluminum oxide may also be generated on the first adherent member. As a result of the third treatment, a region composed of the layer of the first adherent member and the layer of the second adherent member laminated in the recited order is formed on the surface of the core particle. Fluorescent material particles further incorporating the second adherent member on the first adherent member, which is disposed on the surface of the core particles, have improved moisture resistance. A light emitting device incorporating such fluorescent material particles have improved moisture resistance and improved temporal stability.

Examples of the organic aluminum compound to be applied to the third treatment include trialkylaluminum, trialkoxyaluminum, and dialkylaluminum halide, such as dimethylaluminum chloride. Among them, in view of moisture resistance and ease of handling, trialkylaluminum is preferable, and trialkylaluminum having an alkyl group having from 1 to 3 carbons is more preferable.

An example of the method of generating an aluminum oxide compound from an organic aluminum compound is as follows. For example, when the organic aluminum compound is trialkylaluminum, an aluminum oxide may be generated by oxidation treatment of the trialkylaluminum. As an example, the reaction formula of oxidation treatment of trimethylaluminum is shown below.

$$(2Al(CH_3)_3 + 12O_2 \rightarrow Al_2O_3 + 6CO_2 + 9H_2O)$$

Aluminum oxide is generated from trialkylaluminum by such an oxidation treatment. When the organic aluminum compound is trialkoxyaluminum, an aluminum oxide can be generated by, for example, oxidation treatment, or a combination of hydrolysis and dehydration treatment.

To further improve moisture resistance, the third treatment is preferably performed in a gas phase, and more preferably in a fluid bed containing an inert gas. That is, the second adherent member is preferably produced by a chemical vapor deposition. Unlike a second adherent member generated in a liquid phase, when the second adherent member is produced by a chemical vapor deposition, the second adherent member contains substantially no hydroxy group, so that the moisture resistance is further improved. Performing the third treatment in a gas phase enables uniform formation of the second adherent member, thereby further improving moisture resistance of the fluorescent material particles. To perform the third treatment in a gas phase, for example, a fluidized bed chemical vapor deposition (CVD) system can be used.

An example of the third treatment may be performed as follows. Core particles having the first adherent member are charged into a reaction tube for generating a fluidized bed, and a mixed gas containing an organic aluminum compound and an inert gas is supplied from the bottom of the reaction tube. Examples of the inert gas include nitrogen and a rare gas. The concentration of the organic aluminum compounds in the mixed gas is, for example, from 0.5 vol % to 3.5 vol %.

To generate an aluminum oxide by oxidation treatment, it is preferable to supply oxygen into the reaction tube. Oxygen may be supplied into the reaction tube either from the top or bottom of the tube, and is preferably supplied from the top. The temperature of the reaction tube in the oxidation treatment of the organic aluminum compound is, for example, 150° C. or more, and may be from 300° C. to 400° C. The reaction time is, for example, 1 hour or more, and may be from 1 hour to 24 hours.

The method for producing the fluorescent material particles may further include, after the third treatment, dispersion treatment and classification treatment, as necessary.

Light Emitting Device

The light emitting device of the present embodiment includes a fluorescent material containing the fluorescent material particles, and a light source that emits light having a peak light emission wavelength in the range of from 380 nm to 485 nm.

A light emitting device incorporating a fluorescent material that contains the above-described fluorescent material particles can achieve superior moisture resistance and long-term reliability.

For the light source, for example, a light emitting element can be used. The peak light emission wavelength of the light emitting element lies in the range of from 380 nm to 485 nm, and preferably in the range of from 400 nm to 470 nm. Using a light emitting element having a peak light emission wavelength in this range as an excitation light source yields a light emitting device that emits light resulting from a mix of the light emitting element and fluorescence from the fluorescent material. In addition, because this allows effective use of the light radiated from the light emitting element to the outside, the loss of light emitted from the light emitting device can be minimized, resulting in a highly efficient light emitting device.

The half bandwidth of the light emission spectrum of the light emitting element is not particularly limited. The half bandwidth may be, for example, 30 nm or less.

The light emitting element is preferably a semiconductor light emitting element. Using a semiconductor light emitting element as the light source provides a highly efficient light emitting device that has high output linearity to the input and is resistant and stable to mechanical impact.

For example, a semiconductor light emitting element that includes a nitride semiconductor $(In_XAl_YGa_{1-X-Y}N$, wherein X and Y satisfy $0 \leq X$, $0 \leq Y$, and $X+Y \leq 1$), which emits blue or green light, for example, may be used as the semiconductor light emitting element.

The fluorescent material preferably includes, in addition to the above-described fluorescent material particles, at least one type of other fluorescent materials. Suitable examples of the other fluorescent materials include a fluorescent material that emits red light in response to light from a light emitting element. Specifically, a nitride fluorescent material of a composition represented by formula (II) or (III), a fluoride fluorescent material of a composition represented by formula (IV), or the like may be further incorporated as a fluorescent material that emits red light. In particular, when a light emitting device further incorporating a fluoride fluorescent material of a composition represented by formula (IV) is used as a back light source for an image display, the range of color reproduction can be broaden than the ranges of conventional ones.

When the fluorescent material further includes other fluorescent materials, the other fluorescent materials may be used alone or in combination.

$$(Ca_{1-p-q}Sr_pEu_q)AlSiN_3 \quad (II)$$

In formula (II), p and q satisfy $0 \leq p \leq 1.0$, $0 < q < 1.0$, and $p+q < 1.0$.

$$(Ca_{1-r-s-t}Sr_rBa_sEu_t)_2Si_5N_8 \quad (III)$$

In formula (III), r, s, and t satisfy 0≤r≤1.0, 0≤s≤1.0, 0<t<1.0, and r+s+t≤1.0.

$$A_2[M^4{}_{1-u}Mn^{4+}{}_uF_6] \quad (IV)$$

In formula (IV), A is at least one selected from the group consisting of alkali metal and $NH_4$, $M^4$ is at least one element selected from the group consisting of elements from Group 4 of the periodic table and elements from Group 14 of the periodic table, and u satisfies 0<u<0.2.

The light emitting device may include, for example, a fluorescent member that incorporates a fluorescent material and a resin, and the fluorescent member may cover the light emitting element. Examples of the resin incorporated in the fluorescent member include a thermoplastic resin and a thermosetting resin. Specific examples of thermosetting resin include an epoxy resin, a silicone resin, and a modified silicone resin, such as epoxy-modified silicone resin.

Configuration of fluorescent materials and the content ratio of the fluorescent materials relative to the resin in the fluorescent member may be appropriately selected depending on, for example, the purpose.

The fluorescent member may incorporate other components in addition to the fluorescent material and the resin as necessary. Examples of the other components may include a filler, such as silica, barium titanate, titanium oxide, and aluminum oxide; a light stabilizer; and a colorant. When the fluorescent member incorporates other components, the contents of the other components are not particularly limited, and may be appropriately selected according to the purpose, for example. When a filler is incorporated as another component, for example, the content of the filler may be from 0.01 parts by mass to 20 parts by mass relative to 100 parts by mass of the resin.

The form of the light emitting device is not particularly limited, and may be suitably selected from conventional forms. Examples of the forms of the light emitting device include through-hole mounting and surface mounting types. In through-hole mounting, generally, a light-emitting device is fixed to a mount board by placing leads of the light-emitting device into through-holes formed in the mount board. In contrast, with surface mounting, the leads of the light-emitting device are fixed to the surface of the mount board.

Figure 4:
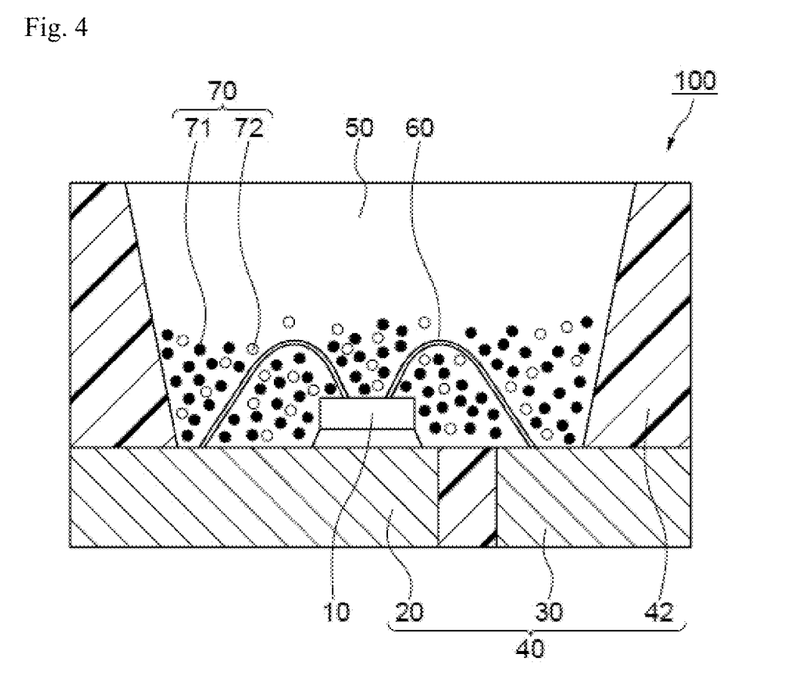
FIG. 4 is a schematic cross-sectional view of an example of a light emitting device according to the present embodiment.

An example of a light emitting according to the present embodiment will be explained with reference to the drawings. FIG. 4 is a schematic cross-sectional view of an example of a light emitting device 100 according to the present embodiment. The light emitting device 100 is an example of a surface mounting type-light emitting device.

The light emitting device 100 emits visible light at short-wavelengths and includes a light emitting element 10 made of a gallium nitride compound-semiconductor having a peak light emission wavelength of from 380 nm to 485 nm and a molded body 40 on which the light emitting element 10 is disposed. The molded body 40 includes a first lead 20, a second lead 30, and resin part 42 containing a thermoplastic resin or a thermosetting resin, which are formed in an integral manner. The molded body 40 has a recess defined by a bottom surface and side surfaces, and the light emitting element 10 is disposed on the bottom surface of the recess. The light emitting element 10 has a pair of electrodes, positive and negative, and the positive and negative electrodes are electrically connected to the first lead 20 and the second lead 30, respectively, with a wire 60. The light emitting element 10 is covered with a fluorescent member 50. The fluorescent member 50 preferably contains a thermosetting resin, such as epoxy resin, silicone resin, epoxy-modified silicone resin, and modified silicone resin. The fluorescent member 50 is composed of fluorescent material 70 that includes a green fluorescent material (a first fluorescent material 71) and a red fluorescent material (a second fluorescent material 72) that convert the wavelength of light emitted from the light emitting element 10, and a resin. The first fluorescent material 71 is a fluorescent material particle that includes a core particle and a first adherent member containing boron oxide according to the present embodiment and being disposed on the surface of the core particle. The first fluorescent material 71 may be a fluorescent material particle that includes a core particle, and a first adherent member containing boron oxide and a second adherent member containing aluminum oxide disposed on the core particle. The second fluorescent material is a nitride fluorescent material of a composition represented by formula (II) or (III), or a fluoride fluorescent material of a composition represented by formula (IV).

The fluorescence member 50 is formed by filling, for example, a translucent resin or glass into the recess of the light emitting device 100 in such a manner to cover the light emitting element 10 disposed in the recess. In view of ease of the production, the material of the fluorescence member is preferably a translucent resin. A silicone resin composition may be preferably used as a translucent resin and an insulating resin composition, such as an epoxy resin composition and an acrylic resin composition, may also be used. The fluorescence member 50, which incorporates a first fluorescent material 71 and a second fluorescent material 72 as fluorescent material 70, may incorporate additional materials as necessary. For example, a light diffusing agent may ease the directivity of light emitted from the light emitting element, widening the angle of visibility.

The fluorescence member 50 serves not only as a member to protect the light emitting element 10, the first fluorescent material 71, and the second fluorescent material 72 from the outside environment, but also as a member to convert the wavelength. In FIG. 4, the particles of the first fluorescent material 71 and the second fluorescent material 72 are unevenly dispersed in the fluorescence member 50. Arranging the particles of the first fluorescent material 71 and the second fluorescent material 72 closer to the light emitting element 10 in this manner allows efficient conversion of the wavelength of light from the light emitting element 10, thereby providing a light emitting device with superior light emitting efficiency. It should be noted that the arrangement of the fluorescent member 50 incorporating the particles of the first fluorescent material 71 and the particles of the second fluorescent material 72, and the light emitting element 10 is not limited to one in which they are in close proximity to each other, and the particles of the first fluorescent material 71 and the second fluorescent material 72 may be arranged spaced apart from the light emitting element 10 within the fluorescence member 50 to avoid the influence of heat on the first fluorescent material 71 and the second fluorescent material 72. The particles of the first fluorescent material 71 and the second fluorescent material 72 may also be approximately evenly dispersed in the entire fluorescence member 50 so as to obtain light with reduced color unevenness.

EXAMPLES

Hereinafter, the Examples of the present invention will be specifically described, but the present invention is by no means limited to these Examples.

Preparation Example (Sr,Eu)SO$_3$ and Ga(SO$_4$)OH, as starting materials, were weighed so as to have a desired composition and then dry-mixed and sintered at 900° C. for 2 hours in the hydrogen sulfide atmosphere. Next, the sintered substance was subjected to dispersion treatment and then to separation, drying, and sifting treatment to yield a fluorescent material powder of a composition represented by formula (Sr$_{1-x}$Eu$_x$)Ga$_2$S$_4$ (x=0.03) (hereinafter also referred to as "SGS fluorescent material").

The resultant SGS fluorescent material has a peak light emission wavelength of 533 nm.

Example 1

20 g of the SGS fluorescent material and 0.57 g of boric acid (H$_3$BO$_3$) were mixed to obtain a mixture. The resultant mixture was subjected to the first treatment under the conditions of a temperature of 130° C., a relative humidity of 100%, and a pressure of 0.27 MPa for 1 hour in a PCT apparatus. Subsequently, the second treatment was carried out under the conditions of a temperature of 600° C. for 1 hour to obtain fluorescent material particles.

Example 2

Fluorescent material particles were obtained in the same manner as Example 1 except that 20 g of the SGS fluorescent material and 1.14 g of boric acid (H$_3$BO$_3$) were mixed to obtain a mixture.

Example 3

Fluorescent material particles were obtained in the same manner as Example 1 except that 20 g of the SGS fluorescent material and 2.29 g of boric acid (H$_3$BO$_3$) were mixed to obtain a mixture.

Example 4

Fluorescent material particles were obtained in the same manner as Example 1 except that 20 g of the SGS fluorescent material and 3.43 g of boric acid (H$_3$BO$_3$) were mixed to obtain a mixture.

Example 5

Fluorescent material particles were obtained in the same manner as Example 1 except that 20 g of the SGS fluorescent material and 5.72 g of boric acid (H$_3$BO$_3$) were mixed to obtain a mixture.

Example 6

Fluorescent material particles were obtained in the same manner as Example 1 except that 20 g of the SGS fluorescent material and 11.44 g of boric acid (H$_3$BO$_3$) were mixed to obtain a mixture.

Example 7

Fluorescent material particles were obtained in the same manner as Example 1 except that 20 g of the SGS fluorescent material and 17.16 g of boric acid (H$_3$BO$_3$) were mixed to obtain a mixture.

Comparative Example 1

The SGS fluorescent material obtained in the preparation example was used as it is as fluorescent material particles.

Comparative Example 2

The SGS fluorescent material obtained in the preparation example was subjected to the second treatment under the condition of a temperature of 600° C. for 1 hour, without being subjected to the first treatment, to yield a fluorescent material particle.

Comparative Example 3

20 g of the SGS fluorescent material and 3.43 g of boric acid (H$_3$BO$_3$) were mixed to obtain a mixture. The resultant mixture was subjected to the first treatment under the conditions of a temperature of 130° C., a relative humidity of 100%, and a pressure of 0.27 MPa for 1 hour, in a PCT apparatus, without being subjected to the second treatment, to yield a fluorescent material particle.

Comparative Example 4

The SGS fluorescent material was subjected to a coating treatment by a sol-gel method, without being subjected to the first and second treatments. Specifically, 20 g of the SGS fluorescent material was added to ethanol and suspended. To this, 4.6 g of pure water and 16.6 g of Si(OEt)$_4$ were added, and 4.6 g of aqueous ammonia as a catalyst was further added and allowed to be hydrolyzed at 60° C. Fluorescent material particles coated with silicon dioxide by the sol-gel method were obtained.

The content by percentage of silicon dioxide in the fluorescent material particles coated with the silicon dioxide, which was measured in the same manner as the method for evaluation described later, was 19.0% by mass in the fluorescent material particles. The average percentage of the thickness of the silicon dioxide film relative to the long diameter of the fluorescent material particles was 6.2%.

Comparative Example 5

15 g of the SGS fluorescent material was charged into a reaction tube of a fluidized bed powder CVD system. A mixture of tetramethoxysilane and nitrogen gas (TMOS/N$_2$) was fed from the bottom of the reaction tube at a rate of 0.04 L/min, and O$_2$ was fed from the bottom of the reaction tube at a rate of 0.06 L/min (both of the flow rates were at 25° C.), and the reaction was allowed to continue at a tube temperature of 300° C. for 25 hours to carry out oxidation treatment of TMOS (composition: Si(OCH$_3$)$_4$). As a result of a combustion reaction represented by the following formula, a silicon dioxide film was deposited on the surface of the fluorescent material particles in a gas phase to yield fluorescent material particles to which silicon dioxide was adhered.

(Si(OCH$_3$)$_4$+6O$_2$→SiO$_2$+4CO$_2$+6H$_2$O)

The content by percentage of silicon dioxide in the fluorescent material particles coated with silicon dioxide, which was measured in the same manner as the method for evaluation described later, was 1.7% by mass in the fluorescent material particles.

Comparative Example 6

Fluorescent material particles to which silicon dioxide was adhered were obtained in the same manner as Comparative Example 5 except that the reaction was allowed to continue for 98 hours. The amount of adhesion of silicon dioxide was 15.1% by mass.

Example 8

Fluorescent material particles to which boron oxide was adhered were obtained in the same manner as Example 1 except that 20 g of the SGS fluorescent material and 3.43 g of boric acid ($H_3BO_3$) were mixed to obtain a mixture. The amount of adhesion of boron was 2.7% by mass.

Next, 20 g of the SGS fluorescent material to which boron oxide was adhered was charged into a reaction tube of the fluidized bed powder CVD system. A mixture of trimethylaluminum and nitrogen gas (TMA/$N_2$) was fed from the bottom of the reaction tube at a rate of 0.02 L/min, and oxygen gas ($O_2$) was fed from the top of the reaction tube at a rate of 0.06 L/min (both of the flow rates were at 25° C.), and the reaction was allowed to continue in the reaction tube at a temperature of 300° C. for 16 hours to carry out oxidation treatment of TMA (composition: $Al(CH_3)_3$) (the third treatment) to yield a fluorescent material particle having an adherent member containing boron oxide to which aluminum oxide is adhered.

The content by percentage of aluminum element, which was measured according to the method for evaluation described later, was 2.7% by mass in the fluorescent material particles. The average percentage of the thickness of the lower layer adherent member containing boron oxide (the first adherent member) was 9.4%, and the average percentage of the thickness of the upper layer adherent member containing aluminum oxide (the second adherent member) was 9.8%.

Comparative Example 7

20 g of the SGS fluorescent material was charged into a reaction tube of the fluidized bed powder CVD system. TMA/$N_2$ was fed from the bottom of the reaction tube at a rate of 0.02 L/min, and $O_2$ was fed from the top of the reaction tube at a rate of 0.06 L/min (both of the flow rates were at 25° C.), and the reaction was allowed to continue in the reaction tube at a temperature of 300° C. for 29 hours to carry out oxidation treatment of TMA to yield fluorescent material particles to which aluminum oxide was adhered. The content by percentage of the aluminum element in the fluorescent material particles was 3.8% by mass.

Next, fluorescent material particles to which boron oxide was further adhered were obtained in the same manner as Example 1 through the first and second treatments except that 20 g of the SGS fluorescent material particles to which aluminum oxide was adhered and 3.43 g of boric acid ($H_3BO_3$) were mixed. The amount of adhesion of boron was 2.5% by mass.

The average percentage of the thickness of the lower layer adherent member containing aluminum oxide was 20.0%, and the average percentage of the thickness of the upper layer adherent member containing boron oxide was 8.8%.

[Evaluation]

The fluorescent material particles obtained above were each evaluated for the following properties.

(Sulfidity Evaluation)

2 ml of pure water and 0.5 g of the fluorescent material particles were placed in an autoclave, and silver flakes were further placed in a manner not to directly contact the fluorescent material particles. The autoclave treatment was carried out at 85° C. for 2 hours and then the change in the appearance of the silver flakes was visually inspected, and the degree at which the surface of the silver flakes was sulfureted (sulfidity) was evaluated.

Of the visually inspected silver flakes, those with a low sulfidity were rated as A, those with a high sulfidity were rated as C, and those in the middle were rated as B. The results of evaluation were shown in Tables 1 and 2.

(Mean Particle Diameter)

For the resultant fluorescent material particles, the mean particle diameter was measured as Fisher Sub Sieve Sizer's No. (F.S.S.S.N.), using a Fisher Sub Sieve Sizer (manufactured by Fisher).

(Thickness Ratio of Adherent Member)

The cross-sections of the resultant fluorescent material particles were observed using scanning electron microscopy (SEM), and the ratio of the thickness of the adherent member to the long diameter of the respective fluorescent material particles was calculated by the following formula.

The ratio of the thicknesses of the adherent members to the particle diameter (%)=sum of the thicknesses of adherent members/(the long diameter of the core particle+thicknesses of the adherent members)×100

For three fluorescent material particles, the ratio of the thicknesses of the adherent members to the particle diameter was determined, and the average percentage of the thicknesses of the adherent members was calculated as an arithmetic average. The first adherent member and the second adherent member were distinguishable by the contrast in the SEM images. The results are shown in Tables 1 and 2. Table 2 shows the average percentage of the thickness of the lower layer adherent member, which is closer to the core particle, and the average percentage of the thickness of the upper layer adherent member, which is disposed on the lower layer adherent member, respectively.

(Evaluation of the Content by Percentage of Boron Element)

For the fluorescent material particles obtained above, the content by percentage of the boron element contained in the fluorescent material particles was calculated as follows by using an ICP analyzer.

The content by percentage of boron element (% by mass) contained in the fluorescent material particles=(mass of the boron element/total mass of the fluorescent material particles)×100

Evaluation results are shown in Table 1.

(Evaluation of the Content by Percentage of Aluminum Element)

For the fluorescent material particles obtained above, the content by percentage of the aluminum element contained in the fluorescent material particles was calculated as follows by using an ICP analyzer.

The content by percentage of aluminum element (% by mass) contained in the fluorescent material particles=(mass of the aluminum element/total mass of the fluorescent material particles)×100

Evaluation results are shown in Table 1.

(Evaluation of the Content by Percentage of Silicon Element)

For the fluorescent material particles obtained above, the content by percentage of the silicon element contained in the fluorescent material particles was calculated as follows, by using an ICP analyzer.

The content by percentage of silicon element (% by mass)contained in the fluorescent material particles=(mass of the silicon element/total mass of the fluorescent material particles)×100

Evaluation results are shown in Table 1.

(LED Reliability Evaluation)

A surface mounting type light emitting device was test produced using an LED chip (light emitting element) that has a peak light emission wavelength of 455 nm in combination with the fluorescent material. The fluorescent material particles obtained as described above and $CaAlSiN_3$:Eu, a fluorescent material having a peak light emission wavelength of 650 nm, were blended and then added to a silicone resin, mixed, and dispersed to yield a fluorescent material-containing resin composition so that the mixed colored light emitted by the light emitting device has chromaticity coordinates of around x=0.272 and y=0.247. Next, the fluorescent material-containing resin composition was injected over the light emitting element to cover the light emitting element, followed by curing to produce a light emitting device.

(Evaluation of Boron Compound)

For the fluorescent material particles obtained above, the respective infrared absorption spectra were measured using Fourier transform infrared spectrometer (FT-IR) (manufactured by Thermo Fisher Scientific Inc.). The analysis was conducted by the ATR method.

In any of the fluorescent material particles of Examples 1 to 7, a peak derived from boron oxide was observed at 1260 $cm^{-1}$, whereas no such a peak was observed in any of the fluorescent material particles of Comparative Example 1 to 3. Meanwhile, a peak derived from boric acid was observed in the fluorescent material particles of Comparative Example 3.

Figure 3:
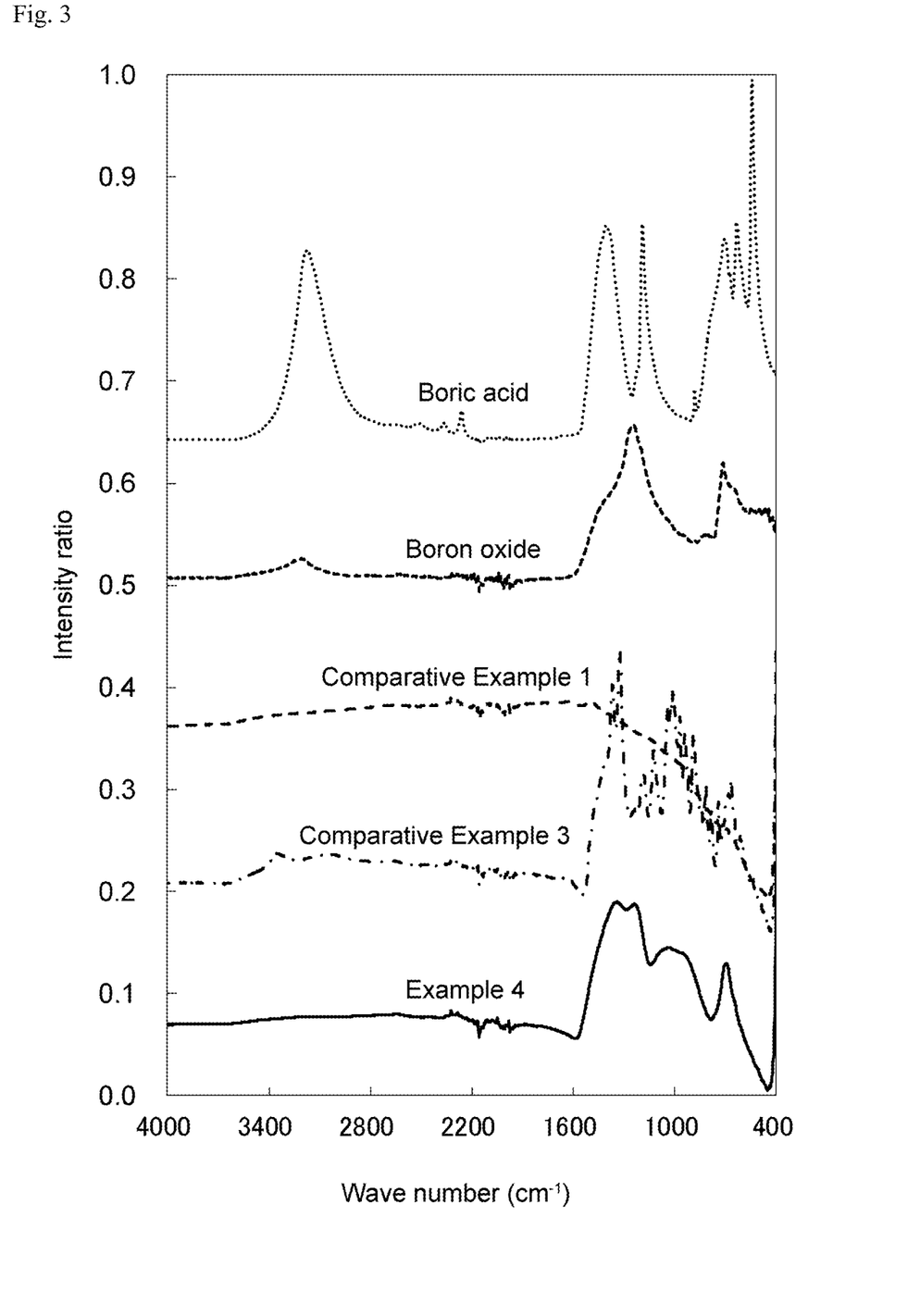
FIG. 3 is a graph showing an example of the spectrum of fluorescent material particles according to the present embodiment, determined by using Fourier transform infrared (FT-IR) spectroscopy.

The infrared absorption spectra of Example 4 and Comparative Examples 1 and 3 together with the infrared absorption spectra of boron oxide and boric acid are shown in FIG. 3.

TABLE 1

|   | First Treatment | Second Treatment | Sulfidity | Mean particle diameter (mm) | Average percentage of adherent member thickness (%) | Boron element content percentage (% by mass) | LED reliability evaluation: Dy | Relative luminous flux: Po |
|---|---|---|---|---|---|---|---|---|
| Ex. 1 | Performed | Performed | B | 3.5 | 2.4 | 0.4 | −0.042 | 99 |
| Ex. 2 | Performed | Performed | A | 3.4 | 3.7 | 0.9 | −0.031 | 100 |
| Ex. 3 | Performed | Performed | A | 3.3 | 6.3 | 1.6 | −0.017 | 100 |
| Ex. 4 | Performed | Performed | A | 3.5 | 5 | 2.3 | −0.016 | 100 |
| Ex. 5 | Performed | Performed | A | 3.6 | 12.8 | 3.3 | −0.023 | 100 |
| Ex. 6 | Performed | Performed | B | 3.7 | 17 | 5.9 | −0.074 | 97 |
| Ex. 7 | Performed | Performed | B | 4.4 | 19.4 | 7.6 | −0.072 | 98 |
| Comp. Ex. 1 | Not performed | Not performed | C | 3.3 | — | — | −0.083 | 95 |
| Comp. Ex. 2 | Not performed | Performed | C | 3.5 | — | — | −0.105 | 91 |
| Comp. Ex. 3 | Performed | Not performed | C | 2.7 | 9.8 | 2.5 | −0.089 | 97 |
| Comp. Ex. 4 | — | — | C | 4.7 | 6.2 | — | −0.092 | 92 |
| Comp. Ex. 5 | — | — | C | 3.6 | 1.1 | — | −0.079 | 95 |
| Comp. Ex. 6 | — | — | C | 4 | 11.6 | — | −0.086 | 94 |

TABLE 2

|   | Sulfidity | Average percentage of lower layer adherent member thickness (%) | Average percentage of upper layer adherent member thickness (%) | Boron element content percentage (% by mass) | Aluminum element content percentage (% by mass) | LED reliability evaluation: Dy | Relative luminous flux: Po |
|---|---|---|---|---|---|---|---|
| Ex. 8 | A | 9.4 | 9.8 | 2.7 | 2.7 | −0.004 | 100 |
| Comp. Ex. 7 | A | 20 | 8.8 | 2.5 | 3.8 | −0.024 | 100 |

The resultant light emitting device was lit continuously by a current of 150 mA in a testing machine under a high temperature and high humidity environment, specifically, at a temperature of 60° C. and a relative humidity of 90%. The difference obtained by subtracting the initial value from value y in the chromaticity coordinates after the lapse of 500 hours was evaluated as an LED reliability Δy. Likewise, the relative luminous flux (Po) after the lapse of 500 hours was also evaluated as a relative value when the initial value of the luminous flux was taken as 100. Evaluation results are shown in Table 1.

Table 1 shows that the values, Δy, in LED reliability evaluation in Examples 1 to 7 are smaller than that of Comparative Example 1, demonstrating an improvement. In addition, the Examples maintain their respective initial luminous fluxes better than Comparative Examples. In particular, Examples 2 to 5 are superior both in Δy of the LED reliability evaluation and maintaining luminous flux.

Comparative Examples 2 and 3 had large Δy, showing no improvement. Likewise, the fluorescent material particles of Comparative Example 4, which were surface-treated with silicon dioxide, showed no improvement. Furthermore, the fluorescent material particles coated with silicon dioxide using a fluidized bed CVD showed no sufficient improvement.

Examples with lower sulfidity of silver flakes in the sulfidity evaluation demonstrated an improvement in Δy of the LED reliability evaluation. Meanwhile, examples with larger sulfidity of silver flakes had a tendency to show larger Δy.

This may be analyzed, for example, as follows. In the fluorescent material particles with superior sulfidity, the influence of the adherent member disposed on the surface of each particle is large, so that hydrolysis reaction of the fluorescent material particles due to moisture in the atmosphere is reduced. Thus, generation of hydrogen sulfide, which causes sulfidation of silver flakes, is considered to be minimized. Because the fluorescent material particles are thus superior in moisture resistance, it is inferred that when the fluorescent material particles are used in combination with a light emitting element to fabricate a light emitting device, the light emitting properties of the fluorescent material particles degrade less. Thus, the fluorescent material particles with superior sulfidity demonstrated an improvement in LED reliability evaluation.

Table 2 shows that disposing the second adherent member containing aluminum oxide, on the first adherent member containing boron oxide, further improves reliability of the LED. In comparison to Example 8, Comparative Example 7, in which configuration of the adherent members are changed, shows less LED reliability. This is inferred, for example, when aluminum oxide and boron oxide are compared, boron oxide is rather more soluble in water, so that the LED reliability of Comparative Example 7, in which boron oxide is adhered on the top surface was inferior to Example 8, in which aluminum oxide was adhered on the top surface.

Figure 1:
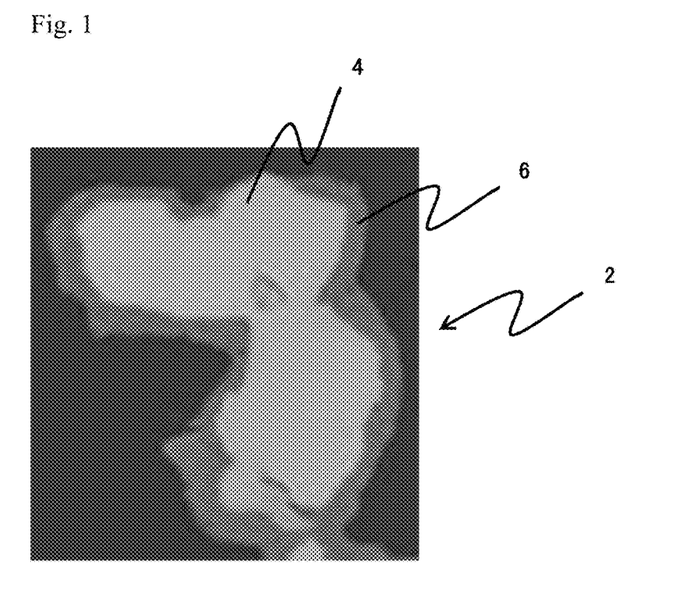
FIG. 1 is a cross-sectional SEM image of an example of a fluorescent material particle according to the present embodiment.

FIG. 1 shows an example of the cross-sectional SEM image of the fluorescent material particles of Example 5. In FIG. 1, the surface of the aggregate of core particles 4 is coated with the first adherent member 6, which contains boron oxide, in the form of a substantially uniform film, resulting in the fluorescent material particle 2.

Figure 2:
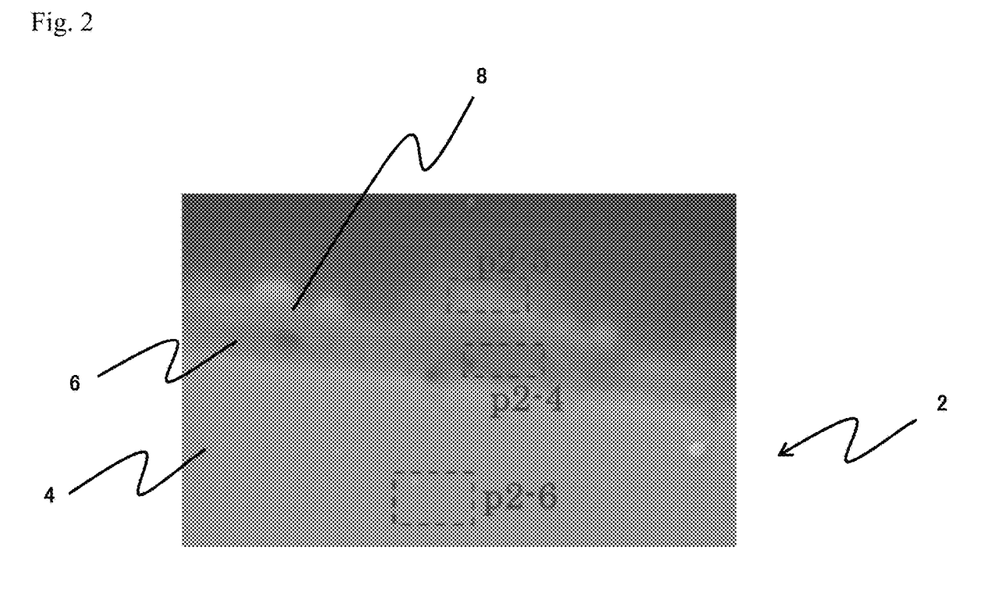
FIG. 2 is a cross-sectional SEM image of another example of a fluorescent material particle according to the present embodiment.

FIG. 2 shows an example of the cross-sectional SEM image of the vicinity of the surface of the fluorescent material particle of Example 8. In FIG. 2, the first adherent member 6, which contains boron oxide, is formed on the surface of the core particle 4 in the form of a substantially uniform film, and on top of the first adherent member 6, the second adherent member 8, which contains aluminum oxide, is formed in the form of a substantially uniform film, resulting in the fluorescent material particle 2. In FIG. 2, when the region named p2-6 was analyzed using SEM-EDX (scanning electron microscopy/energy dispersive X-ray spectroscopy, manufactured by Hitachi Ltd.), the composition of the core particle was detected. From the region labeled p2-4, boron oxide was detected, and from the region labeled p2-5, aluminum oxide was detected.

The light emitting device of the present disclosure, which includes a blue light-emitting diode as a light source, exhibits superior light emitting properties, and can be suitably used, for instance, as a light source for a white LED display, a light source for a backlight, and an illumination light source. The light emitting device may also be used as a light emitting device for backlight for monitors and smartphones, for example, which are desired to reproduce deep and bright RGB colors.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims. All publications, patent applications, and technical standards mentioned in this specification are herein incorporated by reference to the same extent as if each individual publication, patent application, or technical standard was specifically and individually indicated to be incorporated by reference.

What is claimed is:

1. A fluorescent material particle comprising:
   a particle comprising a thiogallate phosphor,
   a first adherent layer comprising boron oxide and being disposed on a surface of the particle, wherein contents of components other than the boron oxide in the first adherent layer account for 10% by mass or less, and
   a second adherent layer comprising aluminum oxide on a surface of the first adherent layer;
   wherein a content of boron element in the fluorescent material particle is 0.3% by mass to 8% by mass, and
   wherein the first adherent layer has an average percentage of thickness of from 3% to 15% relative to a particle diameter of the fluorescent material particle,
   wherein the particle has a region on its surface that the first adherent layer is not disposed on, and wherein the second adherent layer is disposed on the region.

2. The fluorescent material particle according to claim 1, wherein the first adherent layer comprises boron element in an amount of from 0.3% by mass to 3.3% by mass in the fluorescent material particle.

3. The fluorescent material particle according to claim 1, having a mean particle diameter of from 1 μm to 30 μm.

4. The fluorescent material particle according to claim 1, wherein the second adherent layer comprises aluminum element in an amount of from 1% by mass to 4% by mass in the fluorescent material particle.

5. The fluorescent material particle according to claim 1, wherein the second adherent layer has an average percentage of thickness of from 1.5% to 20% relative to a particle diameter of the fluorescent material particle.

6. The fluorescent material particle according to claim 1, wherein the second adherent layer is a chemical vapor deposit.

7. The fluorescent material particle according to claim 1, wherein the thiogallate phosphor has a composition represented by formula (Ia):

$$(M^1_{1-x}M^2_x)Ga_{2-y}S_{4-z} \quad \text{(Ia)}$$

wherein
$M^1$ denotes at least one element selected from the group consisting of Sr, Be, Mg, Ca, Ba, and Zn,
$M^2$ denotes at least one element selected form the group consisting of Eu and Ce, and
x, y and z satisfy $0.03 \leq x \leq 0.25$, $-0.2 \leq y \leq 0.2$ and $-0.2 < z < 0.2$.

8. The fluorescent material particle according to claim 1, wherein the thiogallate phosphor has a composition represented by formula (Ib):

$$(Sr_{1-v-w}M^3_w Eu_v)Ga_2S_4 \quad \text{(Ib)}$$

wherein
$M^3$ denotes at least one element selected from the group consisting of Be, Mg, Ca, Ba, and Zn, and
v and w satisfy $0.03 \leq v \leq 0.25$, $0 \leq w < 0.97$ and $v+w<1$.

9. A light emitting device comprising:
   a fluorescent member comprising the fluorescent material particle according to claim 1 and a resin, and a light source that emits light having a peak light emission wavelength in a range of from 380 nm to 485 nm.

10. The light emitting device according to claim 9, wherein the fluorescent member further comprises at least one nitride fluorescent material of a composition represented by formula (II) or (III):

$$(Ca_{1-p-q}Sr_pEu_q)AlSiN_3 \quad (II)$$

wherein p and q satisfy $0 \leq p \leq 1.0$, $0 < q < 1.0$, and $p+q < 1.0$, $$(Ca_{1-r-s-t}Sr_rBa_sEu_t)_2Si_5N_8 \quad (III)$$

wherein r, s, and t satisfy $0 \leq r \leq 1.0$, $0 \leq s \leq 1.0$, $0 < t < 1.0$, and $r+s+t \leq 1.0$.

11. The light emitting device according to claim 9, wherein the fluorescent member further comprises at least one fluoride fluorescent material of a composition represented by formula (IV):

$$A_2[M^4{}_{1-u}Mn^{4+}{}_uF_6] \quad (IV)$$

wherein
A is at least one cation selected from the group consisting of alkali metal and $NH_4$, $M^4$ is at least one element selected from the group consisting of elements from Group 4 of the periodic table and elements from Group 14 of the periodic table, and u satisfies $0 < u < 0.2$.

12. A method for producing the fluorescent material particle according to claim 1, comprising:
performing a first treatment of a mixture comprising particles that comprise a thiogallate phosphor, and a boron compound under conditions of a temperature of from 50° C. to 150° C. and a relative humidity of from 80% to 100%, and
performing a second treatment of the mixture after the first treatment under condition of a temperature of from 200° C. to 1000° C.

13. The method according to claim 12, wherein the boron compound comprises at least one compound selected from the group consisting of boric acid ($H_3BO_3$), metaboric acid ($HBO_2$), tetraboric acid ($H_2B_4O_7$), borate ($M_3(BO_3)_2$), metaborate($M(BO_2)_2$), tetraborate ($MB_4O_7$), wherein M denotes at least one element selected from the group consisting of Be, Mg, Ca, Sr, and Ba, and boron oxide ($B_2O_3$).

14. The method according to claim 12, wherein the first treatment is performed under a pressure of from 0.1 MPa to 0.6 MPa.

15. The method according to claim 12, wherein the first treatment is performed in a treatment time of from 0.5 hour to 50 hours.

16. The method according to claim 12, wherein the second treatment is performed in a treatment time of from 1 hour to 100 hours.

17. The method according to claim 12, wherein the boron compound is comprised in the mixture in an amount of from 0.5% by mass to 15% by mass.

18. The method according to claim 12, further comprising a third treatment of generating an aluminum oxide from an organic aluminum compound in the presence of the mixture after the second treatment.

19. The method according to claim 18, wherein the third treatment is carried out in a fluidized bed comprising an inert gas.

20. The fluorescent material particle according to claim 1, wherein the first adherent layer has an average percentage of thickness of from 5% to 15% relative to a particle diameter of the fluorescent material particle.

21. The fluorescent material particle according to claim 1, wherein the first adherent layer has an average percentage of thickness of from 5% to 6.3% relative to a particle diameter of the fluorescent material particle.

22. The fluorescent material particle according to claim 1, wherein the content of boron element in the fluorescent material particle is from 0.9% by mass to 3.3% by mass.

23. The fluorescent material particle according to claim 1, wherein the content of boron element in the fluorescent material particle is from 1.6% by mass to 3.3% by mass.

24. The fluorescent material particle according to claim 1, wherein the content of boron element in the fluorescent material particle is from 2.3% by mass to 3.3% by mass.

25. The fluorescent material particle according to claim 1, wherein the first adherent layer has an average percentage of thickness of from 6.3% to 15% relative to a particle diameter of the fluorescent material particle.

26. The fluorescent material particle according to claim 1, wherein contents of components other than the aluminum oxide in the second adherent layer account for 10% by mass or less.

27. The fluorescent material particle according to claim 1, wherein contents of components other than the aluminum oxide in the second adherent layer account for 1% by mass or less.

* * * * *